(12) United States Patent
Beattie et al.

(10) Patent No.: US 7,302,661 B2
(45) Date of Patent: Nov. 27, 2007

(54) EFFICIENT ELECTROMAGNETIC MODELING OF IRREGULAR METAL PLANES

(75) Inventors: Michael W. Beattie, Austin, TX (US); Anirudh Devgan, Austin, TX (US); Byron L. Krauter, Leander, TX (US); Hui Zheng, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 11/152,580

(22) Filed: Jun. 14, 2005

(65) Prior Publication Data

US 2006/0282798 A1 Dec. 14, 2006

(51) Int. Cl.
*G06F 17/50* (2006.01)

(52) U.S. Cl. .................. 716/9; 716/7; 716/11

(58) Field of Classification Search .......... 716/1, 716/7, 9, 10, 11
See application file for complete search history.

(56) References Cited

U.S. PATENT DOCUMENTS 6,665,849 B2 * 12/2003 Meuris et al. ............ 716/7

OTHER PUBLICATIONS

Albert Ruehli, "Equivalent Circuit Models for Three-Dimensional Multiconductor Systems," IEEE Transactions on M.T.&T., vol. MTT-22, No. 3, pp. 216-221 (Mar. 1974).
"Fast Field Solvers FAQ" [online], [retrieved on May 18, 2005], retrieved from the Internet <URL: http://www.fastfieldsolvers.com/faq.htm>.

* cited by examiner

*Primary Examiner*—Thuan Do
(74) *Attorney, Agent, or Firm*—Casimer K. Salys; Jack V. Musgrove

(57) ABSTRACT

A method of modeling electromagnetism in an irregular conductive plane, by dividing the surface into a grid of unequal and unaligned rectangles, assigning a circuit node location to a center of each rectangle, and calculating capacitive and inductive parameters based on the center circuit node locations. Rectangulation is accomplished using automated, recursive bisection. Capacitive segments are assigned to each circuit node and coincide with the corresponding rectangles. Inductive segments are assigned between adjacent rectangle pairs, with a width of an inductive segment defined as the common boundary of the corresponding pair of rectangles and the length of the inductive segment defined as the normal distance between circuit nodes of the two rectangles. Placement of the circuit nodes at the centers of the rectangles significantly reduces the number of nodes and segments, and provides a faster yet comprehensive analysis framework.

15 Claims, 5 Drawing Sheets

EFFICIENT ELECTROMAGNETIC MODELING OF IRREGULAR METAL PLANES

CROSS-REFERENCE TO RELATED APPLICATION

This application is related to U.S. patent application Ser. No. 10/738,708 entitled "METHOD, SYSTEM AND PRODUCT FOR VERIFYING VOLTAGE DROP ACROSS AN ENTIRE INTEGRATED CIRCUIT PACKAGE" filed Dec. 17, 2003, which is hereby incorporated.

BACKGROUND OF THE INVENTION

1. Field of the Invention

The present invention generally relates to the design of integrated circuits and packaging for semiconductor chips, and more particularly to a method of modeling electromagnetic properties of a conductive plane in a layer of a chip or package.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

As the size of integrated circuits continues to shrink, and pin densities grow, it becomes increasingly more difficult to interconnect the chip to external circuitry. Chips are commonly attached to a substrate, e.g., a printed circuit board (PCB) using a socket or package which fans out the connections to pads or pins on the PCB. FIG. 1 illustrates a typical chip assembly which includes an IC chip 1, a package 2, a PCB 3, and miscellaneous components such as capacitors 4. These various elements may be electrically coupled using surface-mount connections with C4 solder ball arrays 5. IC chip 1 is connected to package 2 which is in turn connected to PCB 3. Package 2 and PCB 3 both have multiple horizontal layers interconnected by vertical vias. A single layer may contain multiple planes, i.e., some for wiring and others for an electrical ground plane or a power plane. A given plane in package 2 may have multiple connections to the top and bottom surfaces to couple ground or power planes of IC chip 1 to ground or power planes of PCB 3. It is common to find 24 or more levels of wiring within a package.

The package itself can significantly affect the performance of the integrated circuit it supports, particularly as power supply currents, power densities, and operating frequencies increase. It is accordingly important to understand how the electromagnetic properties of the package design will impact the chip assembly. Hardware failures can occur due to, e.g., an inadequate package power grid which cannot be detected with existing package verification procedures. Standardized measurement techniques are difficult to apply to the wide variety of systems that use different application-specific integrated circuits (ASICs) which require a large number of custom IC packages.

There are generally two types of IC packages, ceramic and organic (polymeric). Ceramic packages generally require wider wires, resulting in lower wiring density and more layers. Organic packages can provide narrower wires (with higher wiring density and fewer layers) and are generally less expensive to make. Consequently, organic packages are widely used with ASIC chips. Organic packages, however, tend to have more irregularly-shaped planes and wiring. Although the difficulties of package verification apply to both ceramic and organic packages, these difficulties are exacerbated by the irregular metal planes more commonly found in organic packages.

FIG. 2A depicts an example of an irregular metal plane 6 that might be used in an organic package. The conductive plane has various cutouts to accommodate wiring or pads and holes for mounting or vias. The cutouts and holes are placed at non-uniform locations around the plane, making it very difficult to use simple models for current flow. One approach to simulating irregular planes is to divide up the conductive area into a multitude of rectangles which are then considered as discrete elements of a resistive network. FIG. 2B shows one way that the plane 6 of FIG. 2A could be formed into a grid of rectangles. An integral equation can then be used to derive equivalent circuits, as discussed in the article "Equivalent Circuit Models for Three-Dimensional Multiconductor Systems," by A. Ruehli (IEEE Transactions on Microwave Theory and Techniques, vol. MTT-22, no. 3, pp. 216-221, March 1974). These models, referred to as partial element equivalent circuits (PEEC), provide for the calculation of partial inductances and partial capacitances between adjacent rectangles by establishing segments between adjacent nodes for capacitance (C-segments) and inductance (L-segments). L-segments are separately computed for the two orthogonal directions x and y (capacitance is a scalar value, but inductance is a vector since it depends upon the direction of current flow).

Analysis of a conductive plane using rectangulation offers many benefits. Electromagnetic couplings can be evaluated much more quickly using formulas for capacitance and inductance, and if the number of parameters are limited then efficient hashing can be used to reduce repetitious coupling calculations. There are, however, still some problems with this approach. Current techniques for verifying organic packages require manual gridding of the planes because of their irregular shapes. Manual gridding is both inefficient and error-prone. Furthermore, while the PEEC technique is easy to implement for simple (uniform) rectangular arrays, it is much more difficult when the rectangles are not aligned or are of different sizes. In the most straightforward scenario, where all rectangles are equal and aligned in a neat grid, the circuit can be modeled by placing circuit nodes at the center of the rectangles. The C-segments simply correspond to the rectangle shape, and are assigned the locations of the nodes (one node per C-segment). The $L_x$-segments and $L_y$-segments are the same size as the C-segments but are offset from the C-segments by half a grid spacing, i.e., half the rectangle length or width. For example, a grid of four uniform rectangles placed in a 2×2 configuration will have four C-segments (overlapping the respective rectangles), two $L_x$-segments (one between the two nodes in the upper row, and one between the two nodes in the lower row), and two $L_y$-segments (one between the two nodes in the left column, and one between the two nodes in the right column).

As the grid pattern becomes more irregular, this simple segment model becomes unworkable since the nodes are not collinear. For rectangles that are aligned but of unequal sizes, the rectangles are conventionally modeled with circuit nodes assigned to each of four corners of a rectangle, rather than the center. This type of grid is usually derived from recursive bisectioning. A C-segment is assigned to each of the four corner nodes, with a size that is one-fourth that of the rectangle. $L_x$-segments and $L_y$-segments are centered about the edges (boundaries) of adjacent rectangles. This model results in just slightly more than one node per C-segment.

For the most irregular grids, where rectangles are both unaligned and unequal, circuit nodes can again be placed at the corners, and the $L_x$-segments and $L_y$-segments are similarly centered about the edges of adjacent rectangles. This technique is used by the field solver program known as "FastHenry," described in the FAQ (frequently asked questions) at Internet web page http://www.fastfieldsolvers.com/faq.htm. FastHenry computes the frequency-dependent self and mutual inductances, as well as the resistances, of a generic tridimensional conductive structure. An input file describes the geometry, i.e., the coordinates which specify every rectangular conductor as a sequence of rectilinear segments connected between nodes (points in 3D space).

This model results in much more than one node per C-segment, due to the edge-based $L_x$- and $L_y$-segmentation when creating RLC lumped circuits. The increased number of circuit nodes (and segments) creates a significant delay in the circuit simulation and analysis. A typical ASIC package may have as many as 200,000 nodes, which presents a considerable computational challenge. It would, therefore, be desirable to provide a fast and comprehensive analysis framework to better understand the electromagnetic properties of metal planes and predict package effects. It would be further advantageous if the modeling method could utilize more efficient automation techniques.

SUMMARY OF THE INVENTION

It is therefore one object of the present invention to provide an improved method of simulating the electromagnetic characteristics of a conductive plane.

It is another object of the present invention to provide such a method that is particularly useful in the analysis of conductive planes having irregular shapes.

It is yet another object of the present invention to provide a more efficient, and hence faster, method of modeling a metal plane using rectangulation.

The foregoing objects are achieved in a method of modeling electromagnetism in an irregular conductive surface, by dividing the surface into a grid of polygons wherein at least some adjacent polygons are unequal and unaligned, assigning a circuit node location to a center of each polygon, and calculating one or more electromagnetic parameters of the surface based on the center circuit node locations. In the exemplary implementation the conductive surface is a metal plane which is divided into a grid of non-uniform rectangles. Rectangulation is preferably accomplished using automated, recursive bisection. Capacitive segments are assigned to each circuit node and coincide with the corresponding rectangles, and allow calculation of a capacitance for each circuit node. Inductive segments are assigned between adjacent rectangle pairs, with a width of an inductive segment defined as the common boundary of the corresponding pair of rectangles and the length of the inductive segment defined as the normal distance between circuit nodes of the two rectangles, and allow calculation of an inductance between adjacent rectangles. This segmentation allows placement of the circuit nodes at the centers of the rectangles which results in a significant reduction of nodes and segments, to make more efficient use of computing resources.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
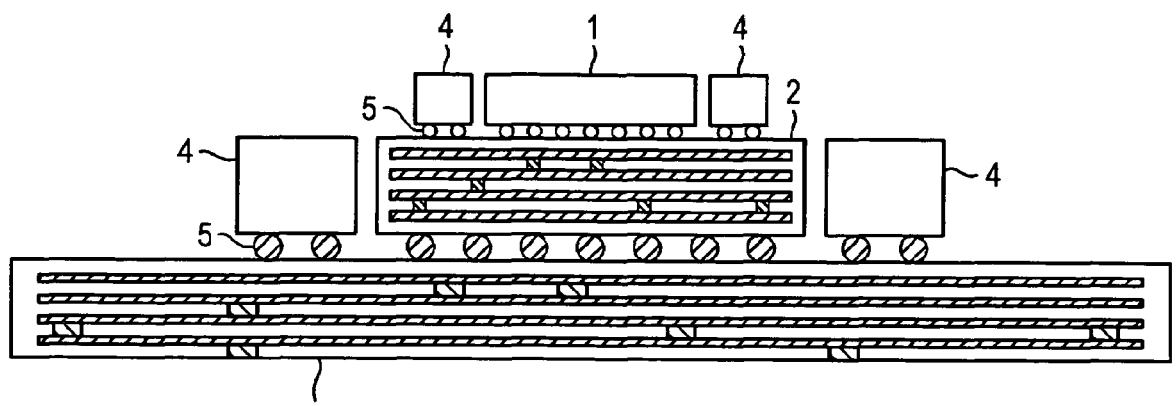
FIG. 1 is a side elevational view of a conventional integrated circuit (IC) chip assembly wherein an IC package interconnects an IC chip to a printed circuit board, with the IC package and printed circuit board shown in cross-section.
Figure 2A:
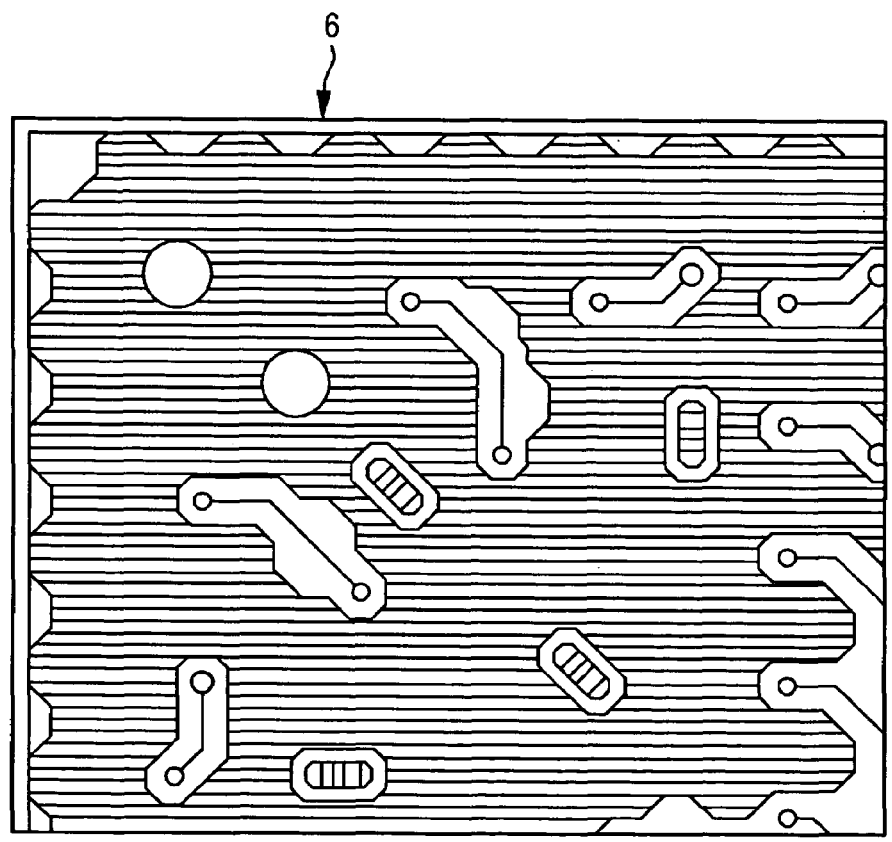
FIG. 2A is a plan view of a metal plane, such as a ground plane or power plane, that may be embedded in one of the layers of the IC package of FIG. 1.
Figure 2B:
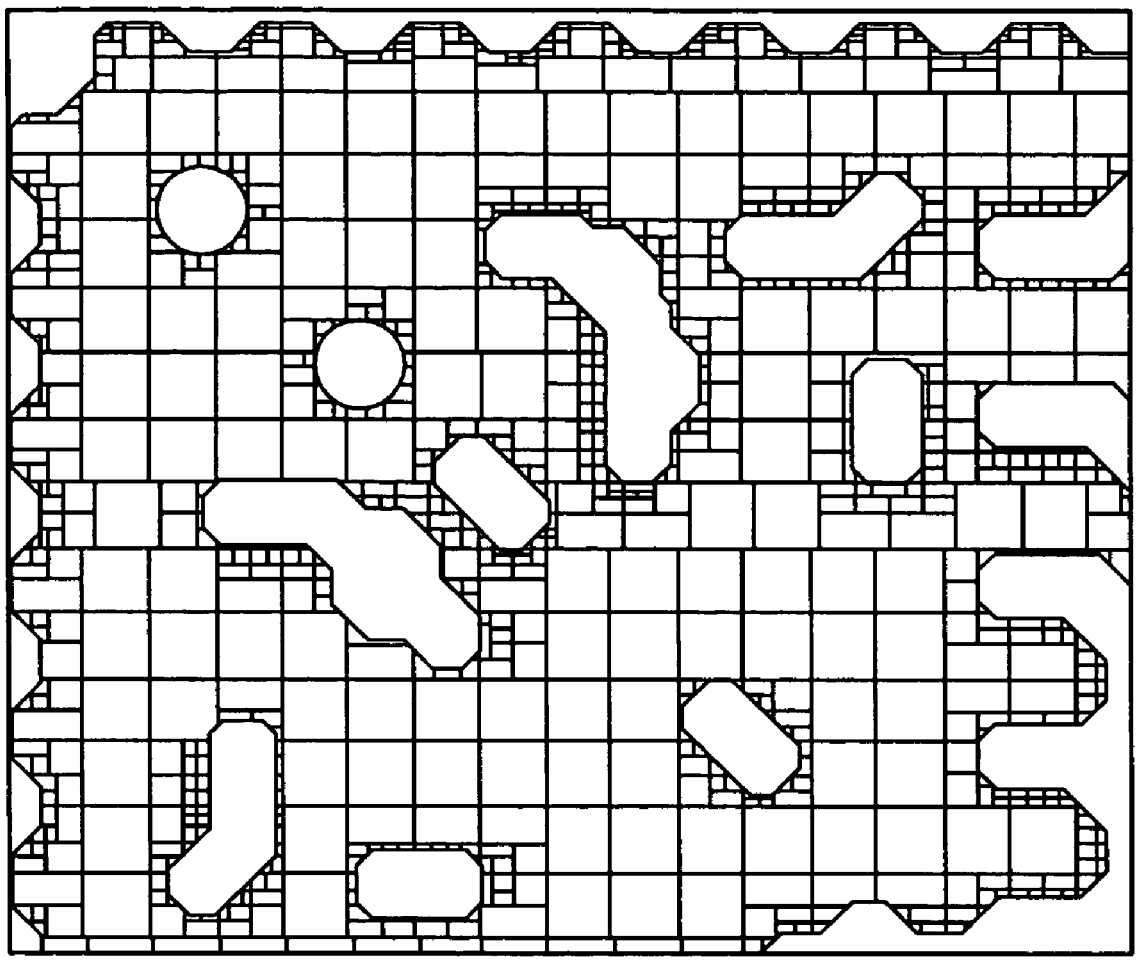
FIG. 2B is a plan view of a grid of rectangles that is used to simulate the electromagnetic response of the metal plane of FIG. 2A.
Figure 3:
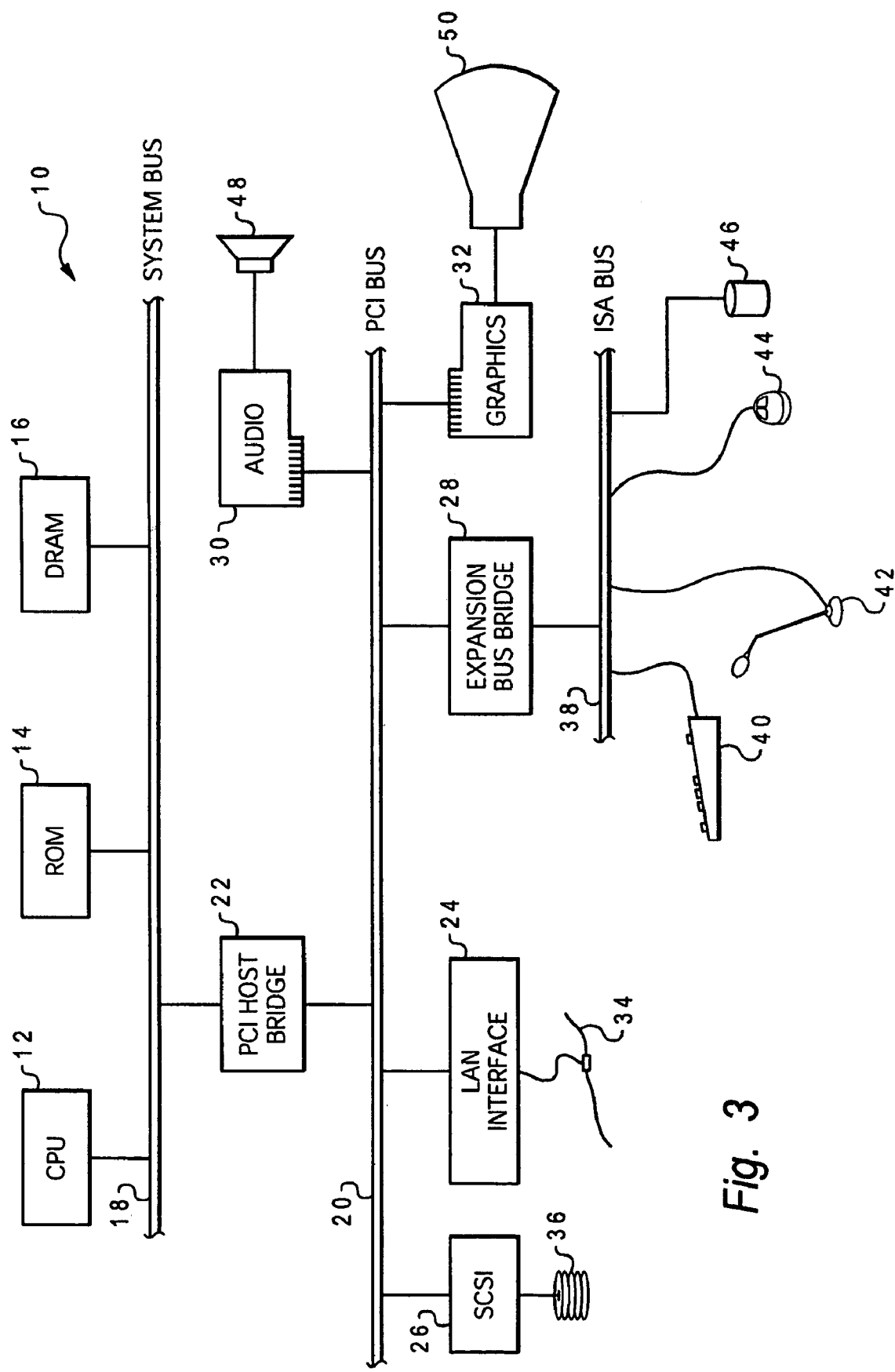
FIG. 3 is a block diagram of a computer system programmed to carry out electromagnetic modeling of an irregular metal plane in accordance with one implementation of the present invention.

With reference now to the figures, and in particular with reference to FIG. 3, there is depicted one embodiment 10 of a computer system programmed to carry out electromagnetic modeling of an irregular conductive plane in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the electromagnetic simulation as taught herein.

While the illustrative implementation provides the program instructions embodying the present invention on disk drive 36, those skilled in the art will appreciate that the invention can be embodied in a program product utilizing other computer-readable media, including transmission media. The program instructions may be written in the C++ programming language for an AIX environment.

Computer system 10 carries out program instructions for a modeling process which subdivides an irregular conductive plane into a multitude of rectangles and uses the rectangles to define circuit nodes and rectilinear conductor segments. Those segments are analyzed to compute circuit parameters and define a resistive network which simulates the irregular conductive plane. A netlist for the resistive network can then be used to compute voltages, current densities, heat generation, etc. The invention is particularly suited to modeling irregular metal planes for integrated circuit (IC) chip packages.

Although rectangulation of the irregular plane may be performed manually, the present invention advantageously utilizes automated rectangulation to more efficiently subdivide the plane. Automated rectangulation is preferably performed in accordance with the method described in U.S. patent application Ser. No. 10/738,708 entitled "METHOD, SYSTEM AND PRODUCT FOR VERIFYING VOLTAGE DROP ACROSS AN ENTIRE INTEGRATED CIRCUIT PACKAGE" filed Dec. 17, 2003, which is hereby incorporated. In that method, the user receives specified maximum and minimum sizes for a grid area, and then removes any overlaps in the geometry shape and detects any intersections among wires and vias to generate a geometric description of the irregular plane. The plane is subdivided into a plurality of non-uniform areas using recursive bisection. A bounding box is defined for each iteration and shrinks down until either a minimum-sized bounding box occurs, or a percentage of the bounding box occupied by a solid shape (i.e., conductor) exceeds a preset threshold.

This method for automatically gridding a plane usually creates non-uniform rectangles, i.e., unequal and unaligned rectangles. As explained in the Background section, such a non-uniform grid is much more difficult to model with regard to capacitance and inductance parameters. The prior art approach for such a grid places circuit nodes at corners of the rectangles to allow creation of L-segments (a model with central nodes was deemed unworkable since the nodes are not collinear). Placement of the circuit nodes at the corners, however, creates an excessively large number of circuit nodes and L-segments. The present invention avoids this problem by establishing circuit nodes at the centers of the rectangles and providing a novel approach to assigning L-segments.

Figure 4A:
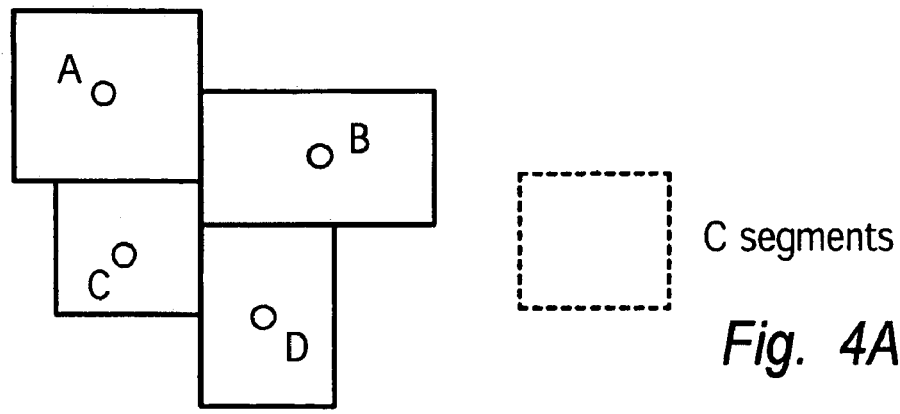
FIG. 4A is a plan view of a simple irregular plane which has been divided into four unaligned and unequal rectangles, wherein nodes are assigned to the rectangle centers with capacitive segments (C-segments) coinciding with the rectangles, in accordance with one implementation of the present invention.

FIGS. 4A-4D illustrate circuit simulation of a simple irregular plane which has been subdivided into four unequal rectangles A, B, C, and D in accordance with one implementation of the present invention. Although the vertical boundaries between rectangles A-B, C-B, and C-D are collinear, the horizontal boundaries between rectangles A-C and B-D are not, so the four rectangles are considered unaligned. The dots at the relative center of each rectangle represent circuit nodes. FIG. 4A shows how the C-segments coincide with the rectangles, i.e., the C-segments are assigned to their respective center nodes.

Inductance segments are assigned between non-aligned nodes. The width of each inductance segment is defined as the intersection of the common edges of the rectangles i.e., the overlap between adjacent C-segment boundaries, and the length of each inductance segment is defined as the normal distance between a pair of nodes, i.e., the segment spans between the nodes. As used herein, the terms "length" and "width" generally refer to two orthogonal dimensions of a plane, but do not necessarily connote that the length is greater than the width, and are not limited to vertical or horizontal dimensions. Moreover, the invention is not only applicable to rectangular subdivisions of the plane interior, but can additionally be applied to other polygons on non-planar surfaces such as triangular subdivisions along a non-orthogonal perimeter.

Figure 4B:
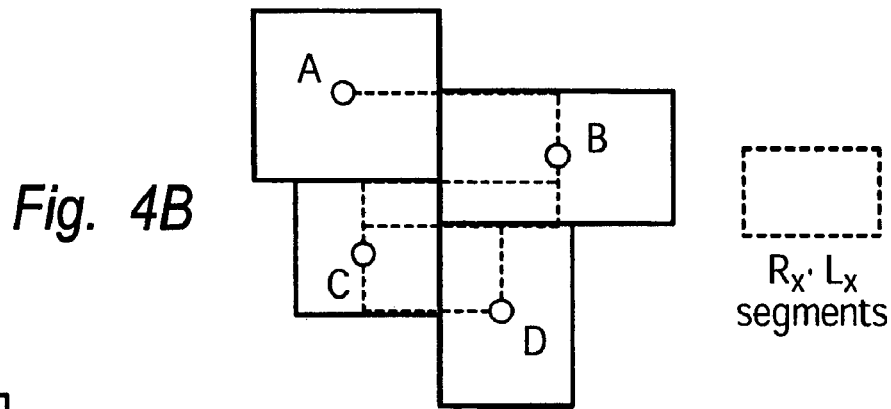
FIG. 4B is a plan view of the irregular rectangles of FIG. 4A illustrating how inductance segments are formed along a horizontal axis ($L_x$-segments) in accordance with one implementation of the present invention.
Figure 4C:
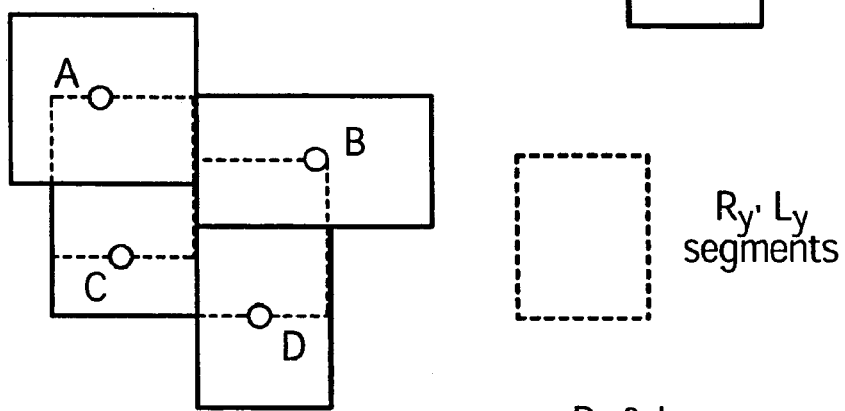
FIG. 4C is a plan view of the irregular rectangles of FIG. 4A illustrating how inductance segments are formed along a vertical axis ($L_y$-segments) in accordance with one implementation of the present invention.

FIG. 4B depicts the formation of three inductance segments along the horizontal direction ($L_x$-segments). There are three $L_x$-segments because there are three touching pairs of rectangles along the x-direction, A-B, C-B, and C-D. FIG. 4C depicts the formation of two inductance segments along the vertical direction ($L_y$-segments). There are two $L_y$-segments because there are two touching pairs of rectangles along the y-direction, A-C and B-D.

These definitions for the L-segments are easily implemented in computer system 10. For a given pair of adjacent rectangles, the $L_x$ upper boundary is the lower one of the two upper boundaries of the paired rectangles, the $L_x$ bottom boundary is the higher one of the two bottom boundaries of the paired rectangles, the $L_x$ left boundary is the node of the left rectangle, and the $L_x$ right boundary is the node of the right rectangle. The $L_y$ left boundary is the rightmost one of the two left boundaries of the paired rectangles, the $L_y$ right boundary is the leftmost one of the two right boundaries of the paired rectangles, the $L_y$ upper boundary is the node of the higher rectangle, and the $L_y$ bottom boundary is the node of the lower rectangle.

Figure 4D:
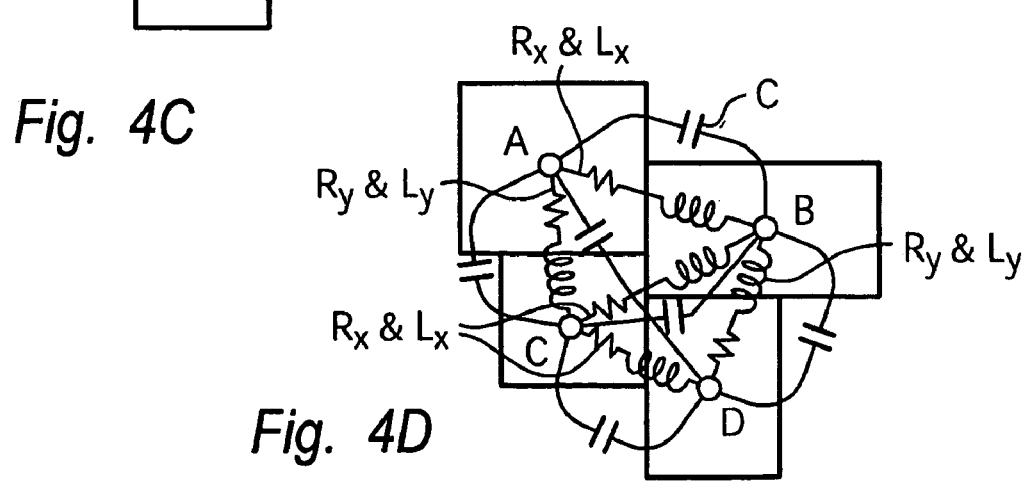
FIG. 4D is a plan view illustrating the electromagnetic coupling between adjacent nodes in the irregular plane of FIG. 4A based on the C- and L-segments in accordance with one implementation of the present invention.

FIG. 4D illustrates an equivalent circuit between the four rectangles that is derived from the foregoing segmentation. The result is a netlist with $R_x$ and $L_x$ components between nodes A-B, C-B, and C-D, $R_y$ and $L_y$ components between nodes A-C and B-D, and C components between each pair of nodes.

The general volume integration for magnetic/inductive couplings is:

$$L_{ij} = \frac{\mu}{4\pi} \frac{1}{A_i A_j} \int_{A_i} \int_{A_j} \int_{l_i} \int_{l_j} \frac{d\vec{l}_i \circ d\vec{l}_j}{\|r_i - r_j\|} da_i da_j$$

Self inductance is just a special case where i=j. When the shapes are rectilinear, the integration can be reduced to a set of formulas based on the physical dimensions using conventional techniques such as PEEC or FastHenry.

Similarly, the general surface integration for electrical/capacitive couplings is:

$$P_{ij} = \frac{1}{4\pi\varepsilon} \frac{1}{S_i S_j} \int_{S_i} \int_{S_j} \frac{1}{\|r_i - r_j\|} ds_i ds_j$$

Self potential is just a special case where i=j. The capacitance matrix is the inverse of the potential matrix.

Resistors are calculated based on the $L_x$- and $L_y$-segments. The formula used is simply Ohm's law:

$$r = \rho \frac{l}{t*w},$$

where $\rho$ is the resistivity of the metal plane, l and w are the length and width of the segment, and t is the thickness of the metal plane.

Figure 5:
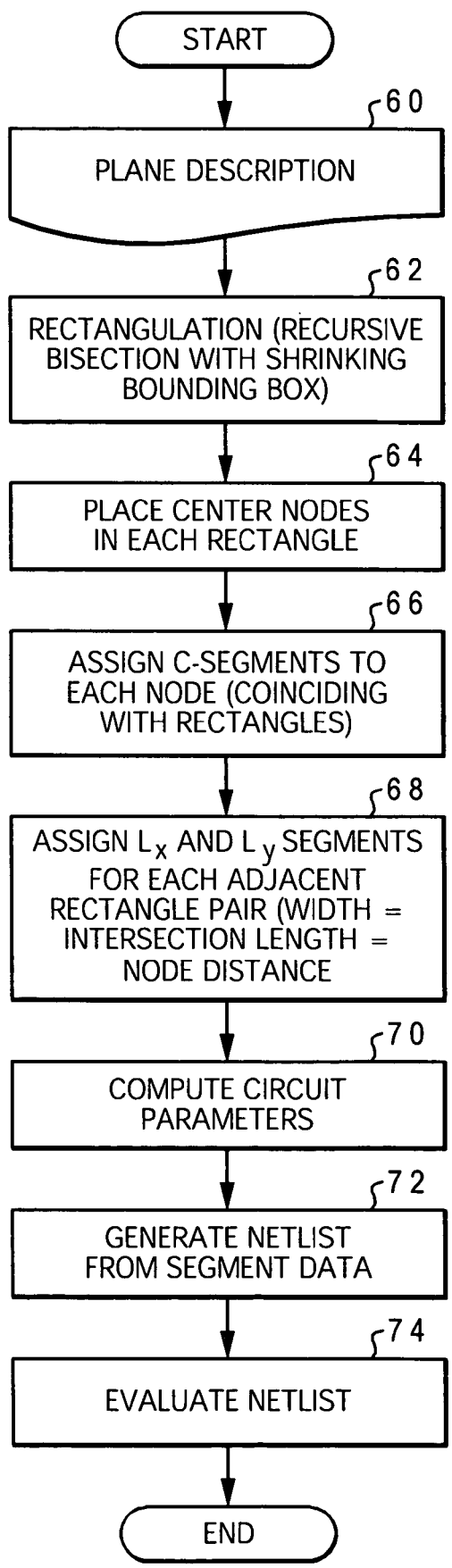
FIG. 5 is a chart illustrating the logical flow for simulation of the electromagnetic response of an irregular plane in accordance with one implementation of the present invention.

The invention may be further understood with reference to the flow chart of FIG. 5. The simulation process begins with the plane description, i.e., a file describing the geometry of the irregular plane to be analyzed (60). This file may be created using commercially available tools such as ALLEGRO, sold by Cadence Design Systems, Inc., of San Jose, Calif. Automated rectangulation is performed on the irregular plane using recursive bisection with a shrinking bounding box as described above (62). Circuit nodes are placed at the center of each rectangle (64), and C-segments are assigned to each node (66). $L_x$- and $L_y$-segments are assigned for each adjacent rectangle pair, the width of an L-segment being the intersection between the rectangles and the length being the normal distance between the nodes (68). Circuit parameters (capacitance, inductance, resistance) are computed using the rectilinear segments (70), and a netlist is generated from the segment data (72). The netlist can then be evaluated to determine its electromagnetic characteristics such as voltages, currents, etc. (74).

Placement of the circuit nodes at the centers of the rectangles results in a significant reduction of C-segments as compared to the conventional approach wherein nodes are assigned to the corners, and the L-segmentation in this invention allows for only one circuit node per C segment. For example, a typical IC package might have around 194,000 circuit nodes using the conventional model, but the present invention only requires about 90,000 circuit nodes for the same package. Fewer nodes and fewer segments translate to much faster simulation time and more efficient use of computing resources. The present invention is advantageous for both ceramic and organic package analysis.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of a metal plane for an interconnect socket/package, it is also applicable to conductive planes of other articles such as a PCB or the IC chip. It is therefore contemplated that such modifications can be made without departing from the spirit or scope of the present invention as defined in the appended claims.

What is claimed is:

1. A method of modeling electromagnetism in an irregular conductive surface, comprising:
   dividing the surface into a grid of polygons wherein at least some adjacent polygons are unequal and unaligned;
   assigning a circuit node location to each polygon, relatively centered within each polygon; and
   calculating one or more electromagnetic parameters of the surface based on the center circuit node locations, including assigning a capacitive segment to each circuit node wherein the shape of a given capacitive segment coincides with the shape of a corresponding polygon, and calculating a capacitance for each of the circuit nodes based on their respective capacitive segments.

2. The method of claim 1 wherein the surface is a plane which is divided into a grid of non-uniform rectangles.

3. The method of claim 2 wherein the plane is divided into the grid of non-uniform rectangles using automated, recursive bisection.

4. The method of claim 1 wherein said calculating includes:
   assigning an inductive segment between each adjacent pair of the polygons, wherein a width of a given inductive segment is defined as the common boundary of a corresponding pair of the polygons; and
   calculating an inductance between each adjacent pair of the polygons based on their respective inductive segments.

5. The method of claim 4 wherein a length of the given inductive segment is defined as the normal distance between circuit nodes of the corresponding pair of the polygons.

6. A computer system comprising:
   one or more processors which process program instructions;
   a memory device connected to said one or more processors; and
   program instructions residing in said memory device for modeling electromagnetism in an irregular conductive surface, by dividing the surface into a grid of polygons wherein at least some adjacent polygons are unequal and unaligned, assigning a circuit node location to each polygon, relatively centered within each polygon, and calculating one or more electromagnetic parameters of the surface based on the center circuit node locations, including assigning a capacitive segment to each circuit node wherein the shape of a given capacitive segment coincides with the shape of a corresponding polygon, and calculating a capacitance for each of the circuit nodes based on their respective capacitive segments.

7. The computer system of claim 6 wherein the surface is a plane, and said program instructions divide the plane into a grid of non-uniform rectangles.

8. The computer system of claim 7 wherein said program instructions further divide the plane into the grid of non-uniform rectangles using automated, recursive bisection.

9. The computer system of claim 6 wherein said program instructions assign an inductive segment between each adjacent pair of the polygons, wherein a width of a given inductive segment is defined as the common boundary of a corresponding pair of the polygons, and calculate an inductance between each adjacent pair of the polygons based on their respective inductive segments.

10. The computer system of claim 9 wherein a length of the given inductive segment is defined as the normal distance between circuit nodes of the corresponding pair of the polygons.

11. A computer program product comprising:
a computer-readable medium; and
program instructions residing in said medium modeling electromagnetism in an irregular conductive surface, by dividing the surface into a grid of polygons wherein at least some adjacent polygons are unequal and unaligned, assigning a circuit node location to each polygon, relatively centered within each polygon, and calculating one or more electromagnetic parameters of the surface based on the center circuit node locations, including assigning a capacitive segment to each circuit node wherein the shape of a given capacitive segment coincides with the shape of a corresponding polygon, and calculating a capacitance for each of the circuit nodes based on their respective capacitive segments.

12. The computer program product of claim 11 wherein the surface is a plane, and said program instructions divide the plane into a grid of non-uniform rectangles.

13. The computer program product of claim 12 wherein said program instructions further divide the plane into the grid of non-uniform rectangles using automated, recursive bisection.

14. The computer program product of claim 11 wherein said program instructions assign an inductive segment between each adjacent pair of the polygons, wherein a width of a given inductive segment is defined as the common boundary of a corresponding pair of the polygons, and calculate an inductance between each adjacent pair of the polygons based on their respective inductive segments.

15. The computer program product of claim 14 wherein a length of the given inductive segment is defined as the normal distance between circuit nodes of the corresponding pair of the polygons.

* * * * *